(12) United States Patent
Lao

(10) Patent No.: US 8,586,267 B2
(45) Date of Patent: Nov. 19, 2013

(54) REMOVABLE TRANSPARENT MEMBRANE FOR A PELLICLE

(75) Inventor: Keith Lao, Austin, TX (US)

(73) Assignees: Samsung Austin Semiconductor, L.P., Austin, TX (US); Samsung Electronics Co., Ltd., Suwon-Si (KR)

( * ) Notice: Subject to any disclaimer, the term of this patent is extended or adjusted under 35 U.S.C. 154(b) by 134 days.

(21) Appl. No.: 13/230,572

(22) Filed: Sep. 12, 2011

(65) Prior Publication Data

US 2013/0065160 A1 Mar. 14, 2013

(51) Int. Cl.
*G03F 1/62* (2012.01)
(52) U.S. Cl.
USPC .................................................. 430/5
(58) Field of Classification Search
USPC .............................. 430/5; 428/14
See application file for complete search history.

(56) References Cited

U.S. PATENT DOCUMENTS

| 6,524,754 B2 | 2/2003 | Eynon |
| 6,573,980 B2 * | 6/2003 | Wang ............................. 355/75 |
| 6,803,996 B2 * | 10/2004 | Kamono ........................ 355/75 |
| 2009/0246644 A1 * | 10/2009 | Chakravorty et al. ............ 430/5 |

FOREIGN PATENT DOCUMENTS

| JP | 7271017 | 10/1995 |
| KR | 10-2004-0098753 | 11/2004 |

\* cited by examiner

*Primary Examiner* — Stephen Rosasco

(57) ABSTRACT

According to one embodiment, a pellicle includes first and second frame members that are selectively removable from one another. The second frame member has an annular shape similar to and is physically coupled to an outer periphery of a transparent membrane. The second frame member configured to be selectively coupled to the first frame member from a engaged position adjacent to the first frame member to a disengaged position in which the second frame member is separated from the first frame member.

20 Claims, 4 Drawing Sheets

REMOVABLE TRANSPARENT MEMBRANE FOR A PELLICLE

TECHNICAL FIELD

This disclosure relates generally to photolithography systems, and more specifically, to a removable transparent membrane for a pellicle.

BACKGROUND

Reticles commonly known as photomasks are devices that may be used for manufacturing integrated circuit (IC) devices using a process commonly known as photolithography. Each reticle generally includes a plate having transparent and opaque or semi-opaque regions that form a pattern when placed within a light beam. The opaque regions may be formed of any material, such as a chrome metal absorbing film deposited on a fused silica plate, that exhibits opacity to the wavelength of the light within the light beam.

Many IC devices are typically manufactured at the sub-micron feature size level. That is, the feature size, which generally represents a dimensional characteristic of components such as transistors that are formed using the IC manufacturing process, may be less than in micrometer in size. When fabricating IC devices at this feature size, airborne particle such as dust, debris, or condensation may become a problem. To solve this problem, pellicles have been implemented that overlay the reticle to inhibit contact of these airborne particles with the surface of the reticle.

SUMMARY

This disclosure provides an apparatus and method for monitoring integrated circuit production.

In a first embodiment, a pellicle includes first and second frame members that are selectively removable from one another. The second frame member has an annular shape similar to and is physically coupled to an outer periphery of a transparent membrane. The second frame member configured to be selectively coupled to the first frame member from a engaged position adjacent to the first frame member to a disengaged position in which the second frame member is separated from the first frame member.

In a second embodiment, a method includes providing a first pellicle having a first and second frame members that are selectably removable from one another in which the second frame member physically coupled to an outer periphery of a transparent membrane. The method further includes securing the first frame member to a reticle, removably securing the second frame member to the first frame member, and using the reticle and the first pellicle to manufacture one or more integrated circuit (IC) devices.

In a third embodiment, a photolithography system includes a reticle configured to selectively block a light beam for manufacturing an integrated circuit (IC) device, and a pellicle. The pellicle includes first and second frame members that are selectively removable from one another. The second frame member has an annular shape similar to and is physically coupled to an outer periphery of a transparent membrane. The second frame member configured to be selectively coupled to the first frame member from a engaged position adjacent to the first frame member to a disengaged position in which the second frame member is separated from the first frame member.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device(s) or system(s). Additionally, the drawings may not be drawn to scale.

Figure 1:
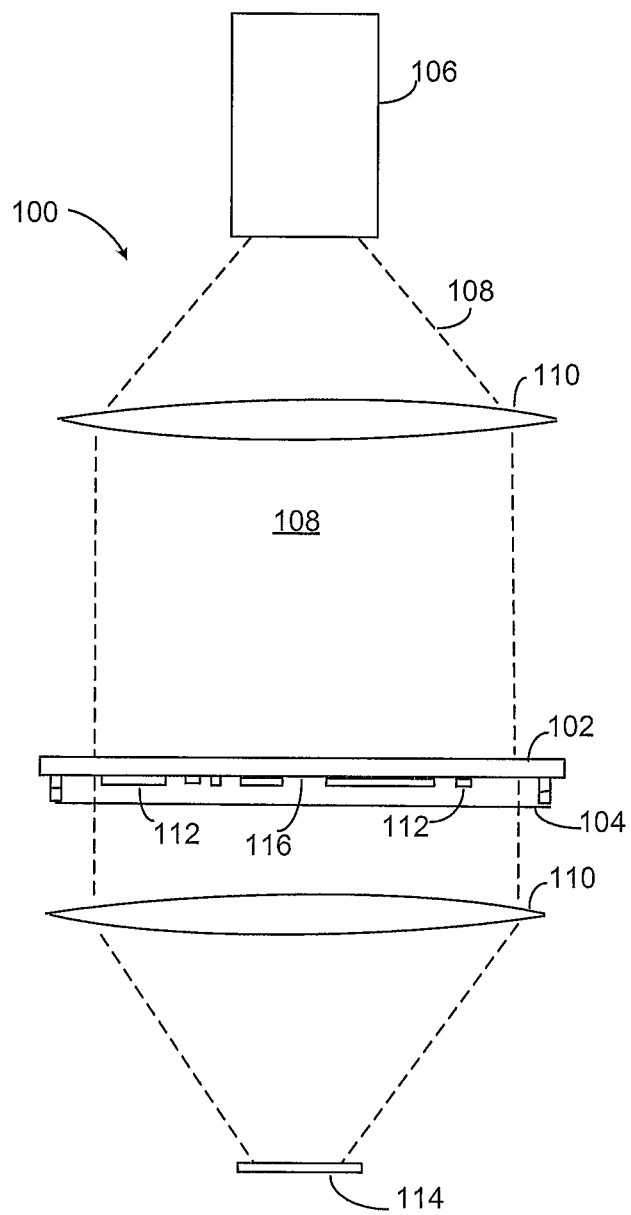
FIG. 1 illustrates an example photolithographic system 100 for manufacturing integrated circuit (IC) devices according to the teachings of this disclosure.

FIG. 1 illustrates an example photolithographic system 100 for manufacturing integrated circuit (IC) devices according to the teachings of this disclosure. The photolithographic system 100 generally includes a reticle 102 on which at least one pellicle 104 is disposed. The photolithographic system 100 also includes a light source 106 that generates a light beam 108 that may be focused using one or more lenses 110 configured above and/or below the reticle 102 and pellicle 104. The reticle 102 includes several opaque regions 112 that form a light pattern on a surface of a semi-conductor wafer 114 when placed within the light beam 108 of the light source 106. Several reticles 102, each having a different arrangement of opaque regions 112, may be consecutively used to form different layers of the semi-conductor wafer 114 to manufacture the IC device.

The reticle 102 may have any desired pattern of opaque regions 112 and transparent regions 116 and be made of any suitable material. For example, the reticle 102 may be formed of a fused silica plate on which one surface is layered with a chrome metal absorbing film defining the opaque regions 112. Other regions of the silica plate not covered by the opaque regions 112 defining one or more transparent regions 116 that allows light from the light beam 108 to shine on the semi-conductor wafer 114. Certain embodiments of the reticle 102 may have a surface area of approximately 25 to 36 square inches. Other embodiments of the reticle 102 may have a surface area greater than 36 square inches or less than 25 square inches. Additionally, the wafer 114 on which the image from the reticle 102 is formed may have any suitable size, such as 6 or 12 inches in diameter.

The light source 106 may include any suitable type. For example, the light source 106 may be a g-line light source that emits light at or near the 436 nanometer wavelength spectrum. As another example, the light source 106 may be a i-line light source that emits light at or near the 365 nanometer wavelength spectrum. As yet another example, the light source 106 may be a ArF light source that comprises a laser that emits light at or near the 248 nanometer wavelength spectrum.

Although FIG. 1 illustrates one example of a photolithographic system 100 for manufacturing an IC device, various changes may be made to FIG. 1. For example, the lenses 110 may have any configuration and number for focusing and columnating the light beam 108 that is shown through the reticle 102 and pellicle 104. As another example, only one pellicle 104 is disposed on one side of the reticle 102. However, it should be understood the two pellicles 102 may be provided in which one pellicle 104 is disposed on one side of the reticle 102 while the other is disposed on the other side of the reticle 102.

Figure 2:
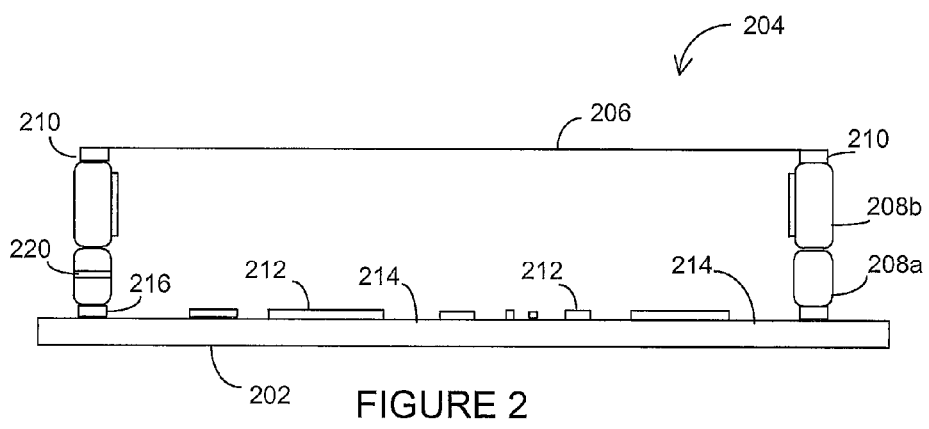
FIGS. 2 and 3 illustrate an example arrangement of a reticle 202 and a pellicle 204 according to one embodiment of the present disclosure.
Figure 3:
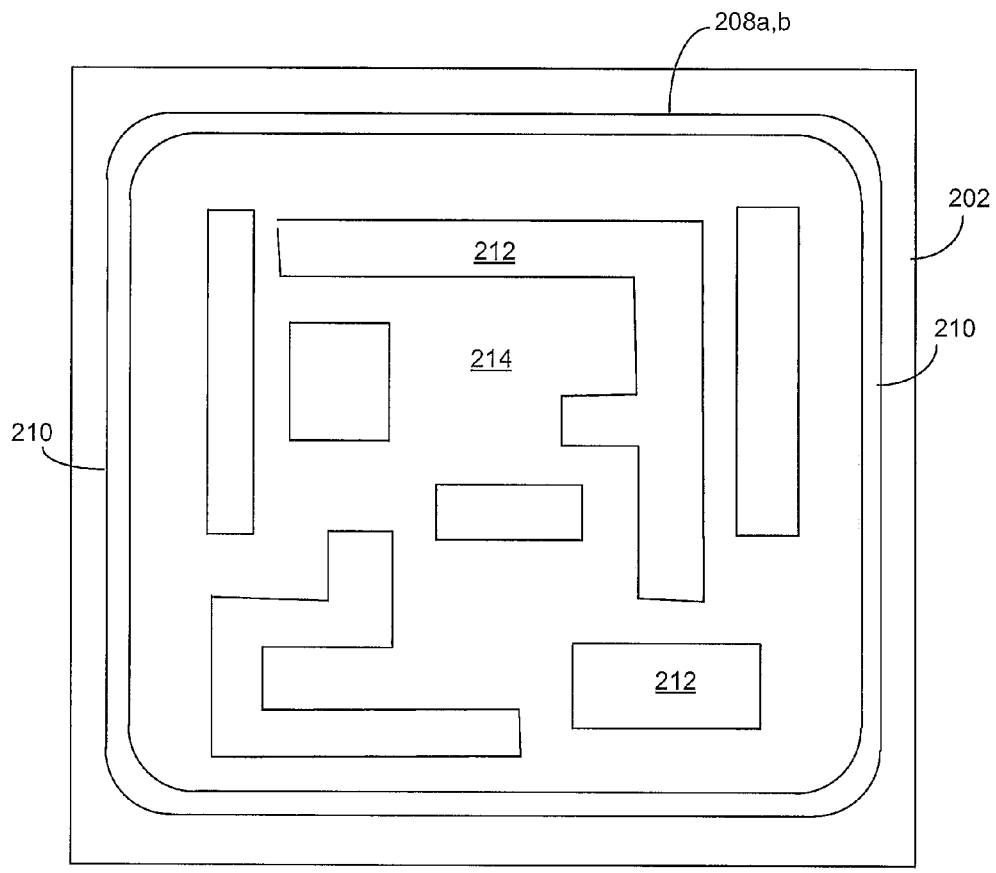

FIGS. 2 and 3 illustrate an example arrangement of a reticle 202 and a pellicle 204 according to one embodiment of the present disclosure. In this particular example embodiment, the pellicle 204 is configured adjacent a chrome surface of the reticle 202. In other embodiments, the pellicle 204 may be configured adjacent the glass surface of the reticle 202. In other embodiments, two pellicles may be provided in which one pellicle 204 is configured adjacent the chrome surface while another pellicle 204 is configured adjacent the glass surface of the reticle 202. The chrome surface generally refers to the surface of the reticle 202 on which the opaque regions 112 have been formed. Conversely, the glass surface generally refers to the surface of the reticle 202 opposite the chrome surface on which no opaque regions have been formed.

The pellicle 204 includes a transparent membrane 206 and a frame including a first frame member 208a and a second frame member 208b. The transparent membrane 206 has an outer periphery 210 of sufficient size to cover most or all of the opaque 212 and transparent 214 regions of the reticle 202. The transparent membrane 206 is physically coupled to the chrome surface of the reticle 202 through the first and second frame members 208a and 208b such that a cavity is formed between the reticle 202 and the transparent membrane 206. In certain embodiments, this configuration may be particularly advantageous in that airborne particles are inhibited from making contact with the chrome surface of the reticle 202. Additionally, those airborne particles that do collect on the surface of the transparent membrane 206 are maintained at a distance from the reticle 202 such that the lenses 110 may be de-focused at this distance to reduce their harmful effects upon the light beam directed through the reticle 202.

The first frame member 208a is physically coupled to the reticle 202 in any suitable manner. In one embodiment, the first frame member 208a is physically coupled to the reticle 202 using an adhesive 216. The second frame member 208b is coupled to the outer periphery 210 of the transparent membrane 206 and has an annular shape similar to the first frame member 208a and the outer periphery of the transparent membrane 206. The second frame member 208b may be physically coupled to the transparent membrane 206 in any suitable manner, such as an adhesive 218.

According to the teachings of the present disclosure, the second frame member 208b is selectively removable from the first frame member 208a from an engaged position adjacent to the first frame member 208a to a disengaged position in which the second frame member 208b is separated from the first frame member 208b. The first and second frame member 208a and 208b may be formed of a rigid or flexible material. In certain embodiments, the first frame member 208a may be formed of a rigid material, such as anodized aluminum, while the second frame member 208b is formed of a relatively flexible material, such as neoprene. Thus, the second frame member 208b may be separated from the first frame member 208a using a pulling action that begins at one corner and continues by bending the second frame member 208b away from the first frame member 208a. Nevertheless, the first and second frame members 208a and 208b may each be formed of any suitable material that allows the second frame member 208b to be separated from the first frame member 208a in a relatively easy manner.

In certain embodiments, this selective removability may provide one or more advantages. For example, selective separation of the second frame member 208b from the first frame member 208a may provide for cleaning of the transparent membrane 206 at a safe distance from the reticle 202 when harsh cleaning agents are used. Additionally, selective separation of the second frame member 208a from the first frame member 208a may provide for periodic replacement of the transparent membrane 206 in a safe, efficient manner. Some photolithographic processes may use a relatively high intensity light beam or other form of radiation treatment, such as X-ray radiation or microwave radiation that may damage or reduce the quality of the transparent membrane 206 over time. Thus, periodic replacement of the transparent membrane 206 may provide a cost effective solution for prolonged use of a reticle 202 that is generally more expensive to produce and maintain.

In certain embodiments, the first frame member 208a may also includes a vent hole 220 to allow air to move to and from the cavity formed between the reticle 202 and the transparent membrane 206. Additionally, certain embodiments may include an adhesive layer 222 applied to the inner surface of the first and/or second frame members 208a and 208b for trapping airborne particles that inadvertently become trapped within the cavity.

Although FIG. 2 illustrates one example of an arrangement of a reticle 202 and one or more pellicles 204, various changes may be made to FIG. 2. For example, the illustrated examples shown are not to scale and various embodiments contemplate an arrangement of a reticle/reticle structure having dimensions other than those shown. Additionally, the first and second frame members 208a and 208b are shown having a generally rectangular shape. However, other embodiments of the pellicle structure may be any annular shape to cover any desired surface of a pellicle, such as a circular shape, a square shape, an octagonal shape, and the like.

Figure 4A:
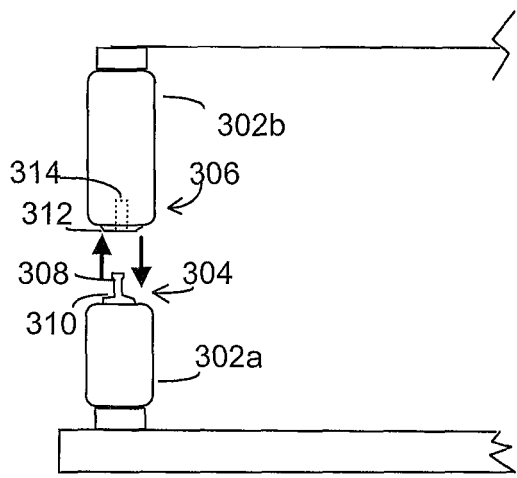
FIGS. 4A and 4B illustrate several example releasable coupling mechanisms that may be used to releasably secure the second frame member 302b to the first frame member 302a according to certain embodiments of the present disclosure.
Figure 4B:
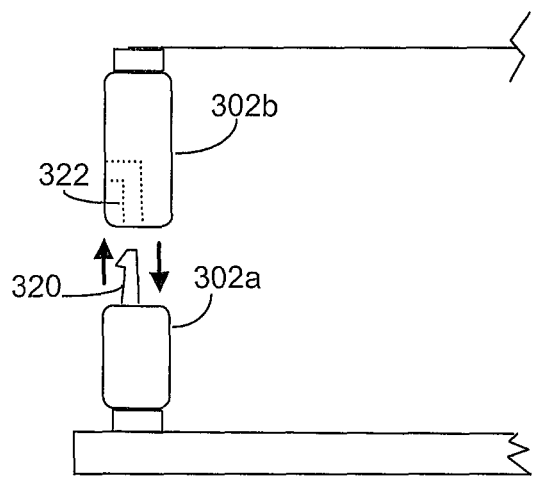

FIGS. 4A and 4B illustrate several example releasable coupling mechanisms that may be used to releasably secure the second frame member 302b to the first frame member 302a according to certain embodiments of the present disclosure. Although two particular example mechanisms are shown, other releasable coupling mechanisms may be used. For example, the second frame member 302b may be releasably secured to the first frame member 302a using clips, clamps, or a releasable pressure sensitive adhesive (PSA) that holds the second frame member 302b to the first frame member 302a, yet may be separated via a specified level of physical force.

As shown in FIG. 4A, one example releasable coupling mechanism includes a snap fastener having a first fastening member 304 and a second fastening member 306. In certain embodiments, a snap fastener such as the one shown may be generally similar to snap fasteners that are used to selective secure portions of a garment or other object made of a fabric material, such as a back-pack together. The first fastening member 304 generally includes a post 308 with an enlarged end affixed to a bracket 310 that may be secure to the first frame member 302a. The second fastening member 306 includes its own bracket 312 that may be affixed to the second frame member 302b. The bracket 312 has a hole 314 formed therein that is configured to receive the post 308 of the first fastening member 304. The hole 314 may also have a resilient opening that deforms when the enlarged end of the post 308 is inserted. Thus, one or more of these snap fasteners may be configured along the periphery of the first and second frame members 302a and 302b and snapped together to provide releasable securement with one another.

As shown in FIG. 4B, another example releasable coupling mechanism includes a hooking mechanism having a hook device 320 configured on the first frame member 302a that may be selectively engaged in a slot 322 formed in the second frame member 302b. The slot 322 includes a catch member and is dimensioned such that the hook device 320 may be inserted the slot 322 such that the hooking portion of the hook device 320 is engaged on the catch member. The catch member may be configured on the surface of the second frame member 302b such that the hook portion of the hook device 322 may be released from the catch member of the slot 322 when the second frame member 302b is removed from the first frame member 302a. Thus, one or more of these hooking mechanisms may be configured along the periphery of the first and second frame members 302a and 302b and snapped together to provide releasable securement with one another.

Although FIGS. 4A and 4B illustrate several examples of releasable securement mechanisms, various changes may be made to FIGS. 4A and 4B. For example, the post 308 and/or the hole 314 of the snap fastener may be integrally formed with the first and/or second frame member 302a and 302b such that their associated bracket 310 and 312 may not be needed. As another example, the post 308 portion of the snap fastener may be configured on the second frame member 302b while the bracket 312 configured with the hole 314 is configured on the first frame member 302a. Additionally, the illustrated examples shown are not to scale and various embodiments contemplate releasable securement mechanisms having dimensions other than those shown.

Figure 5:
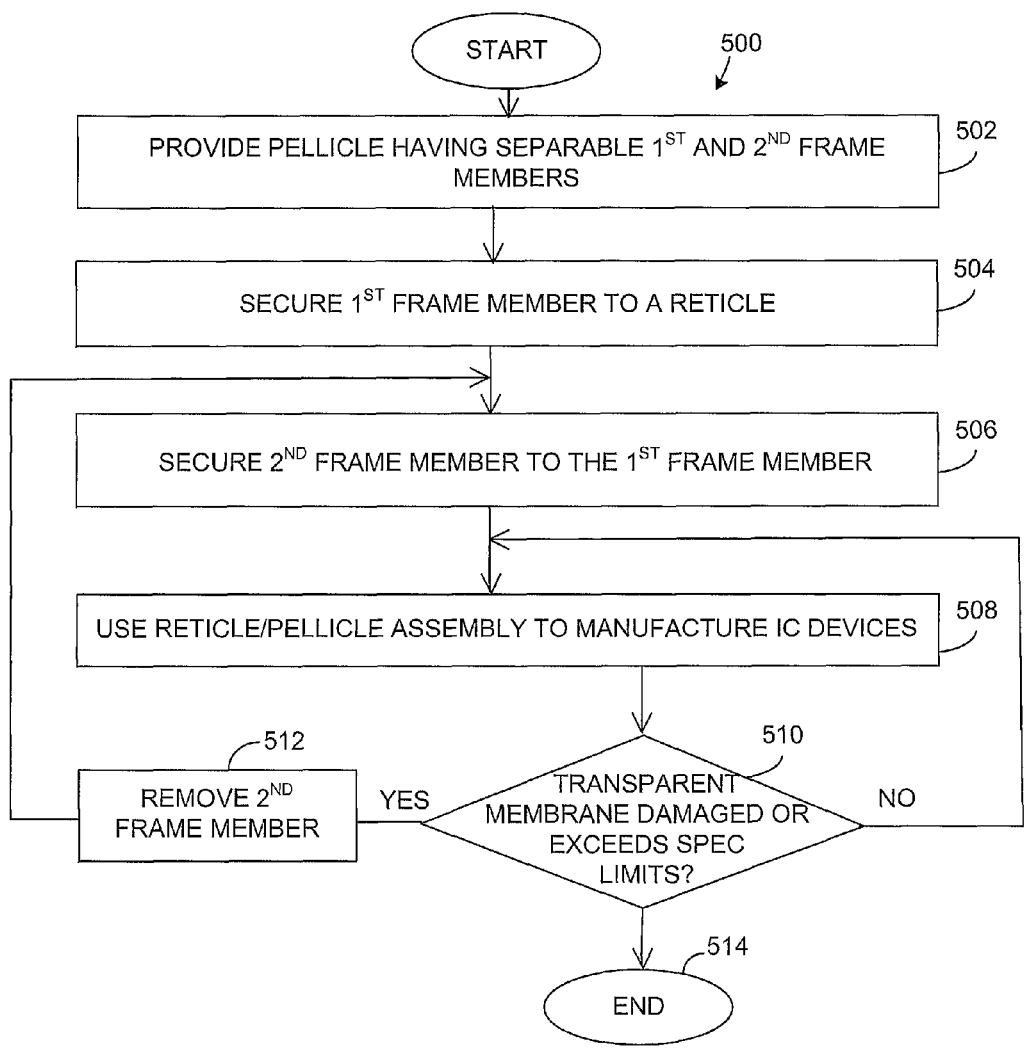
FIG. 5 illustrates an example method 500 that may be performed by the pellicle of FIG. 1 according to the teachings of the present disclosure.

FIG. 5 illustrates an example method 500 that may be performed by the pellicle of FIG. 1 according to the teachings of the present disclosure. In certain embodiments, the method 500 may be performed in a clean room or other environment having relatively little ambient airborne particles, such as dust, condensation, or debris. In step 502, a pellicle having first and second frame members that a separable from one another may be provided.

In step 504, the first frame member may be secured to a surface of a reticle. The first frame member may be secured to either side of the recticle. In certain embodiments, two pellicles may be provided such that the first frame member of one pellicle is secured to one side of the reticle, while the first frame member of the other pellicle is secured to the other side of the reticle. In step 506, the second frame member is releasably secured to the first frame member. Releasable securement may be provided using any releasable securement mechanism as described above.

In step 508, the reticle/pellicle assembly is used to manufacture one or more IC devices. After a specified period of time, the transparent membrane of the pellicle may be inspected to determine whether it is damaged or has exceeded its specifications in step 510. In certain embodiments, the transparent membrane may be removed and replaced at 3 to 6 week intervals for relatively high-end reticles that are used in critical applications. For lower-end reticles, the transparent membrane may be used indefinitely if it is not damaged. If the transparent membrane is not damaged nor has exceeded its specifications, processing continues at step 508 in which the reticle/pellicle assembly is used again to manufacture additional IC devices. However, if the transparent membrane is damaged or has exceeded its specifications, processing continues at step 512.

At step 512, the second frame member is removed from the first frame member. In one embodiment the transparent membrane may be cleaned for re-use. In another embodiment, the second frame member and its associated transparent membrane may be replaced with a new second frame member and associated transparent membrane. In either case, processing continues at step 506, where the cleaned or new second frame member and associated transparent membrane are releasably secured to the first frame member. Thus, the reticle/pellicle assembly may be used again to manufacture more IC devices.

When use of the pellicle is no longer needed or desired, the process ends in step 514.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with" and its derivatives mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "receive" and its derivatives include receipt from an external source or an internal source.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A pellicle comprising:
    a transparent membrane having an outer periphery;
    a frame comprising:
        a first frame member configured to be physically coupled to a surface of a reticle; and
        a second frame member that is coupled to the outer periphery of the transparent membrane, the second frame having an annular shape similar to the first frame member and the outer periphery of the membrane, the second frame member configured to be selectively coupled to the first frame member from an engaged position adjacent to the first frame member to a disengaged position in which the second frame member is separated from the first frame member.

2. The pellicle of claim 1, further comprising at least one snap fastener configured to selectively couple the first frame member to the second frame member.

3. The pellicle of claim 1, further comprising at least one deformable hooking mechanism configured to selectively couple to the first frame member to the second frame member.

4. The pellicle of claim 1, wherein the second frame member is selectively coupled to the frame member using at least one of a clip, a clamp, or a releasable pressure sensitive adhesive (PSA) material.

5. The pellicle of claim 1, wherein the reticle comprises a chrome side and a glass side, the first frame member physically coupled to the chrome side of the reticle.

6. The pellicle of claim 5, wherein the first frame member is physically coupled to the chrome side using an adhesive.

7. The pellicle of claim 5, wherein at least one of the first frame member and the second frame member includes an adhesive along its inner periphery for trapping airborne debris.

8. The pellicle of claim 1, wherein at least one of the first frame member and the second frame member includes a vent hole configured to provide movement of air to and from a cavity formed between the transparent membrane and the reticle.

9. A method comprising:
providing a first pellicle having a first and second frame members that are selectably removable from one another, the second frame member physically coupled to an outer periphery of a transparent membrane;
securing the first frame member to a reticle;
removably securing the second frame member to the first frame member; and
using the reticle and the first pellicle to manufacture one or more integrated circuit (IC) devices.

10. The method of claim 9, further comprising:
providing a second pellicle;
securing the first frame member of the second pellicle to the reticle on an opposing side from which the first pellicle was secured to the reticle.

11. The method of claim 10, wherein the reticle comprises a chrome side and a glass side, the first pellicle being physically secured to the chrome side of the reticle and the second pellicle being physically secured to the glass side of the reticle.

12. The method of claim 9, further comprising:
removing the second frame member from the first frame member;
cleaning the transparent membrane coupled to the first frame member; and
removably securing the second frame member to the first frame member.

13. The method of claim 9, further comprising:
removing the second frame member from the first frame member; and
removably securing another second frame member to the first frame member.

14. The method of claim 9, further comprising:
Removably securing the second frame member to the first frame member using a snap fastener.

15. The method of claim 9, further comprising:
removably securing the second frame member to the first frame member using a deformable hooking mechanism.

16. The method of claim 9, further comprising:
Selectively coupling the second frame member to the frame member using at least one of a clip, a clamp, or a releasable pressure sensitive adhesive (PSA) material.

17. A photolithography system comprising:
a reticle configured to selectively block a light beam for manufacturing an integrated circuit (IC) device;
a transparent membrane having an outer periphery;
a frame comprising:
a first frame member configured to be physically coupled to a surface of the reticle; and
a second frame member that is coupled to the outer periphery of the transparent membrane, the second frame having an annular shape similar to the first frame member and the outer periphery of the membrane, the second frame member configured to be selectively coupled to the first frame member from an engaged position adjacent to the first frame member to a disengaged position in which the second frame member is separated from the first frame member.

18. The photolithography system of claim 17, further comprising at least one snap fastener for selectively coupling the first frame member to the second frame member.

19. The photolithography system of claim 17, further comprising at least one deformable hooking mechanism configured to selectively couple to the first frame member to the second frame member.

20. The photolithography system of claim 17, wherein the reticle comprises a chrome side and a glass side, the first frame member being physically coupled to the chrome side of the reticle.

* * * * *